United States Patent [19]
Yost et al.

[11] Patent Number: 5,444,018
[45] Date of Patent: Aug. 22, 1995

[54] METALLIZATION PROCESS FOR A SEMICONDUCTOR DEVICE

[75] Inventors: Dennis J. Yost; Thomas D. Bonifield, both of Dallas; Roc Blumenthal, Plano, all of Tex.

[73] Assignee: Texas Instruments Incorporated, Dallas, Tex.

[21] Appl. No.: 135,863

[22] Filed: Oct. 13, 1993

Related U.S. Application Data

[63] Continuation of Ser. No. 925,228, Aug. 3, 1993, abandoned, which is a continuation of Ser. No. 708,593, May 31, 1991, abandoned.

[51] Int. Cl.$^6$ .......................................... H01L 21/441
[52] U.S. Cl. ................................ 437/190; 437/192; 437/195; 437/200
[58] Field of Search ............... 437/190, 192, 193, 195, 437/200

[56] References Cited

U.S. PATENT DOCUMENTS

| | | | |
|---|---|---|---|
| 4,724,060 | 2/1988 | Sakata et al. | 204/298 |
| 4,824,544 | 4/1989 | Mikalesen et al. | 204/298 |
| 4,994,410 | 2/1991 | Sun et al. | 437/192 |
| 5,010,032 | 4/1991 | Tang et al. | |
| 5,102,827 | 4/1992 | Chen et al. | 437/190 X |

OTHER PUBLICATIONS

Wolf, S., "Silicon Processing for the VLSI ERA," vol. 2, Lattice Press, Sunset Beach, Calif., 1990, pp. 249–250.

*Primary Examiner*—John S. Maples
*Attorney, Agent, or Firm*—Gary C. Honeycutt; Richard L. Donaldson; William E. Hiller

[57] ABSTRACT

A contact for a semiconductor device has a via extending through a dielectric and collimated titanium in the via. Depositing titanium by collimation places sufficient metal into high aspect ratio contacts to make good electrical connection. The collimated titanium may be reacted in a nitrogen containing ambient to form a titanium silicide layer at the bottom of the contact and a titanium nitride layer over the titanium silicide layer. The titanium silicide layer provides good electrical contact to a device in a silicon semiconductor substrate and lowers contact resistance. Tungsten may be deposited over the colliminated titanium to form a conductor layer. The titanium nitride layer provides a sticking layer for the tungsten. The contact structure and the method are useful in high aspect ratio contacts present in VLSI multilevel interconnected devices such as dynamic random access memories.

5 Claims, 10 Drawing Sheets

METALLIZATION PROCESS FOR A SEMICONDUCTOR DEVICE

This application is a continuation of application Ser. No. 07/925,228, filed Aug. 3, 1993, now abandoned which is a continuation of Ser. No. 07/708/593 filed May 31, 1991, now abandoned.

FIELD OF THE INVENTION

This invention relates to integrated semiconductor devices and more particularly to the fabrication of contacts in such devices.

BACKGROUND OF THE INVENTION

The quest to develop larger and larger semiconductors of the dynamic random access memory (DRAM) type is a well-known goal. The industry has steadily progressed from DRAMs of the 16K type, shown in U.S. Pat. No. 4,081,701 issued to White, McAdams and Redwine, and the 64K type, shown in U.S. Pat. No. 4,055,444 issued to Rao, to DRAMs of the 1M type, as described in U.S. Pat. No. 4,658,377 issued to McElroy. DRAMs of the 4M type are now being produced. Production plans for 16M DRAMs of submicron technology now exist and experimentation of 64M DRAMs has begun. One factor furthering the development of larger DRAMs is the reduction in memory cell geometries as illustrated in U.S. Pat. No. 4,240,092 to Kuo (a planar capacitor cell), and as illustrated in U.S. Pat. No. 4,721,987 to Baglee et al, (a trench capacitor cell).

One difficulty in fabricating high density integrated circuit structures such as DRAMs is filling the contact holes, or vias, with metal so that electrical contact may be made to the integrated circuits. U.S. Pat. No. 4,673,592 to Porter et al. discusses this difficulty and describes a metal planarization process to reliably fill deep depressions having high aspect ratios. In order to minimize space, the aspect ratios of contacts become even higher as memory cell geometries continue to decrease. It becomes even more difficult to fill these high aspect ratio contacts with conductive material.

It is thus an object of this invention to provide a method for packing high aspect ratio via contacts with metal. It is also an object of this invention to provide an improved contact structure.

Other objects and advantages of this invention will be apparent to those of ordinary skill in the art having reference to the following specification and drawings.

SUMMARY OF THE INVENTION

A conductive structure for high aspect ratio contacts has a layer of titanium on the bottom of the contact and a tungsten layer covering it. The titanium may be directionally deposited into the via through collimation. The collimated titanium may be thermally annealed in a nitrogen compound to form a titanium silicide interface at the bottom of the contact. The thermal anneal also forms a titanium nitride over the titanium silicide. It is not necessary to remove the titanium nitride layer from the contacts. It acts as a sticking layer for the layer of tungsten. The layer of tungsten may be formed in the via through chemical vapor deposition. The layer of tungsten may be a multilevel film. A silane reduction step during the chemical vapor deposition forms a first tungsten film to prevent the tungsten from attacking the titanium nitride layer. A second tungsten film is a hydrogen reduced layer to conformally fill the contact. A third tungsten film is a hydrogen reduced layer to smooth the overall tungsten layer, increase its reflectivity, and optimize sheet resistance. The contact and method are advantageous for forming VLSI multilevel interconnected submicron devices having high aspect ratio contacts including, but not limited to, dynamic random access memories.

DETAILED DESCRIPTION OF THE PREFERRED EMBODIMENT

Figure 1:
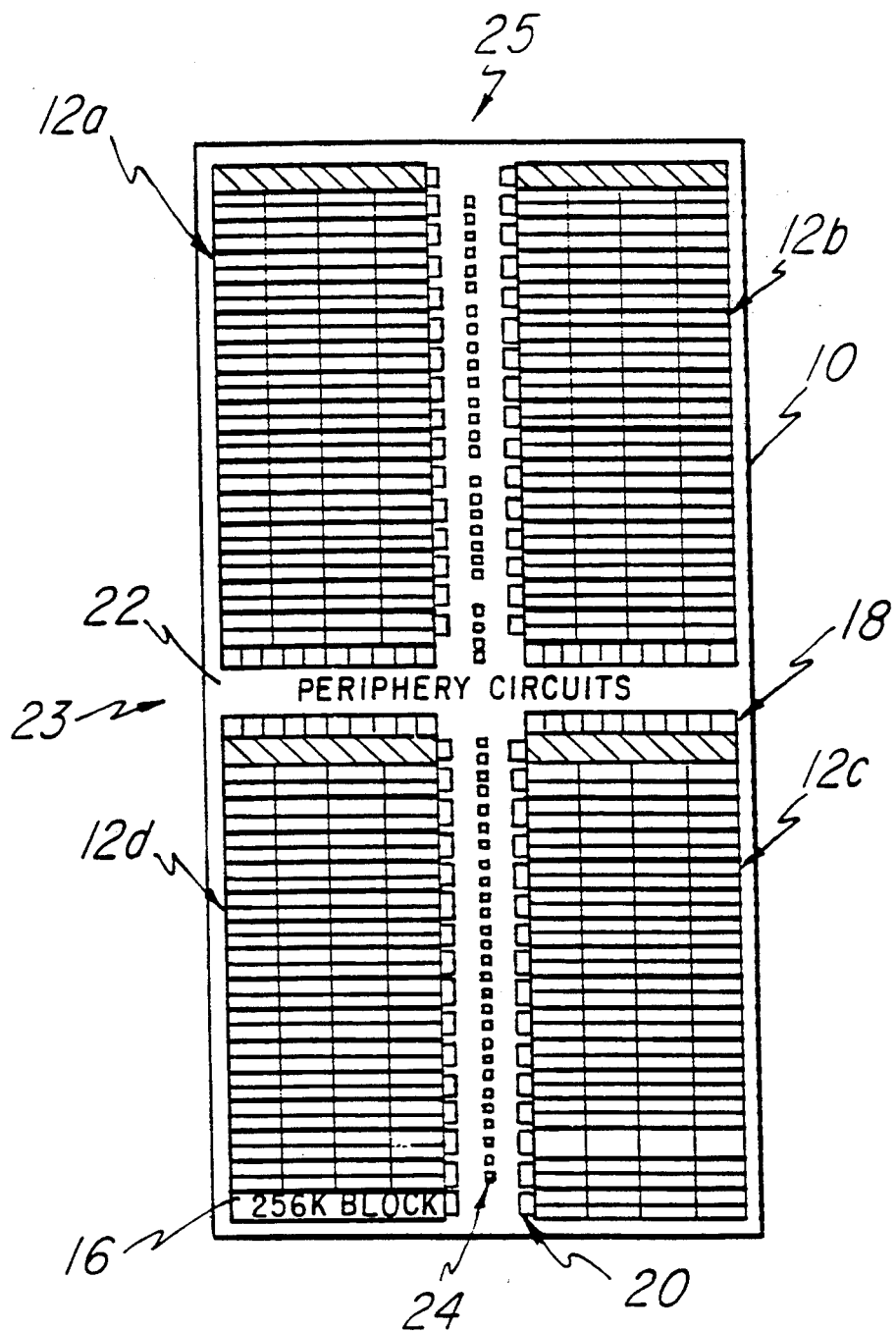
FIG. 1 is a block system level drawing illustrating a semiconductor integrated circuit device on a substrate incorporating the preferred embodiment of the invention.

Referring to FIG. 1, the metalization process of the invention may be used to form contacts on a semiconductor chip 10 having a dynamic random access memory array 12 formed in a face thereof generally by a CMOS submicron process such as disclosed U.S. Pat. No. 5,017,506 issued May 21, 1991 that is assigned to Texas Instruments Incorporated. The dram circuitry may be, for example, a 16 Megabit Dynamic Random Access Memory. The memory array 12 is partitioned into four memory quadrants 12a–12d of 4 Megabits each lying in the active face of semiconductor chip 10 that is formed of silicon. Each memory quadrant 12a–12d contains sixteen memory blocks 16 of 256 Kilobits each. Each memory block 16 contains 1024 bit lines 17, or columns, contains 1024 sense amplifiers, and has 256 word lines 19, or rows. (The bit lines, word lines, and sense amplifiers are not illustrated in FIG. 1 for clarity.) The column decoders 18 lie along the vertical axis 23 of the chip adjacent to their respective memory array quadrants. The row decoders 20 lie along the horizontal axis 25 of the chip adjacent to their respective memory array quadrants. The periphery circuits 22, containing such devices as the input and output buffers and the timing and control circuits, are formed in the periphery of the substrate and are centrally located along the vertical axis of the chip while the bond pads 24 are centrally located along the horizontal axis of the chip. Although not illustrated in FIG. 1 for clarity, the DRAM receives addresses signals A0–A11 and its operation is controlled by the standard signals Row Address Strobe RAS__, Column Address Strobe CAS__, and Write Enable W__. The size of semiconductor chip 10 is about 327×660 mils.

Figure 2:
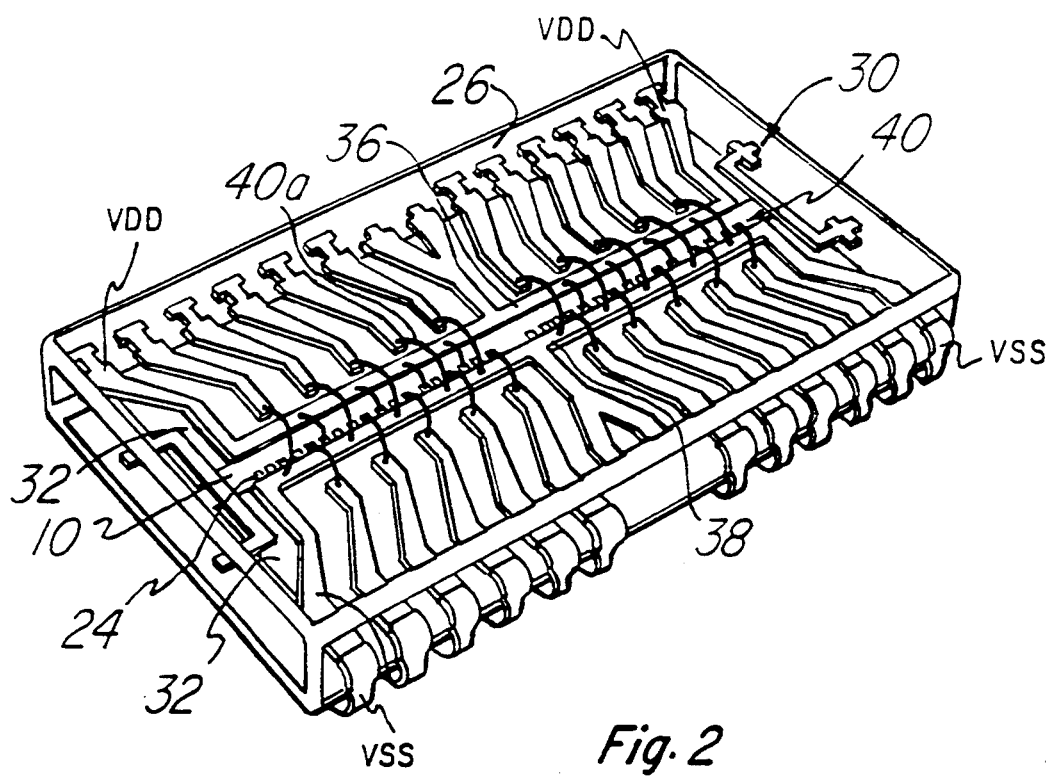
FIG. 2 is a three dimensional view of the packaged, encapsulated, semiconductor integrated circuit device wherein the encapsulant is rendered transparent.
Figure 3:
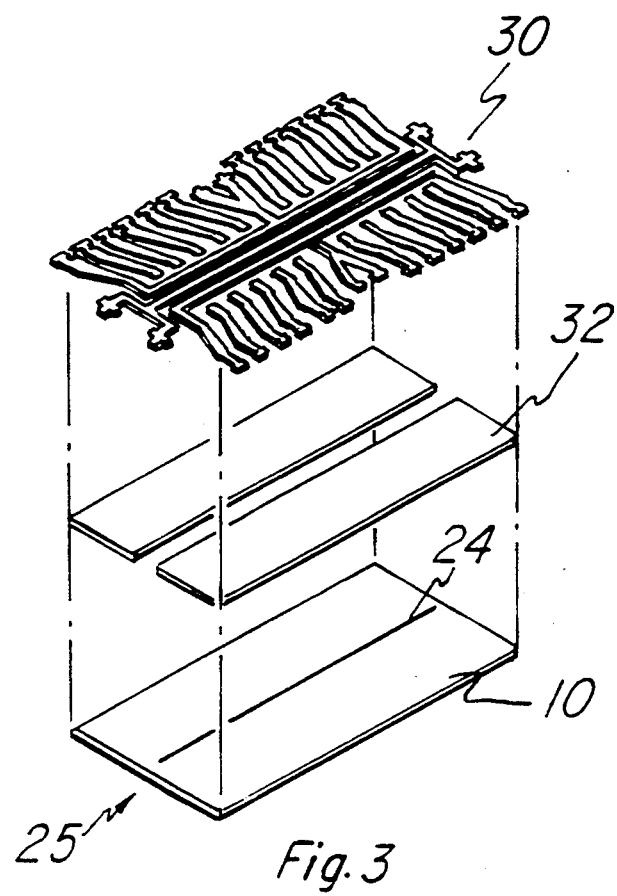
FIG. 3 is a partial assembly view of FIG. 2.

FIG. 2 depicts a three dimensional view of the encapsulated chip 10 wherein the encapsulant 26 is rendered transparent while FIG. 3 presents an assembly view. The chip 10 is encapsulated in a thin plastic small out-line J-type package of the lead over chip center bond (LOCCB) type. The chip 10 underlies the lead frame 30. Two strips of polyimide tape 32 attach the chip 10 to the lead frame 30. The two strips of tape 32 are positioned along the horizontal axis 25 of chip 10 on opposite sides of the bond pads 24 leaving the bond pads uncovered and exposed. When assembled, the bond pads 24 lie between the Vdd power supply bus 36 and the Vss power supply bus 38 of the lead frame 30. Various wire bonds 40 attach the Vdd power supply bus 36 and the Vss power supply bus 38 to various of the bond pads 24 allowing multiple connections from the power supply busses to the semiconductor chip 10. Other wire bonds, such as wire bond 40a, cross over the power supply busses and attach the lead fingers 40 to the bond pads 24. These crossing wire bonds do not touch the power supply busses and no shorting occurs. The size of the encapsulated package is about 400×725 mils.

Figure 4:
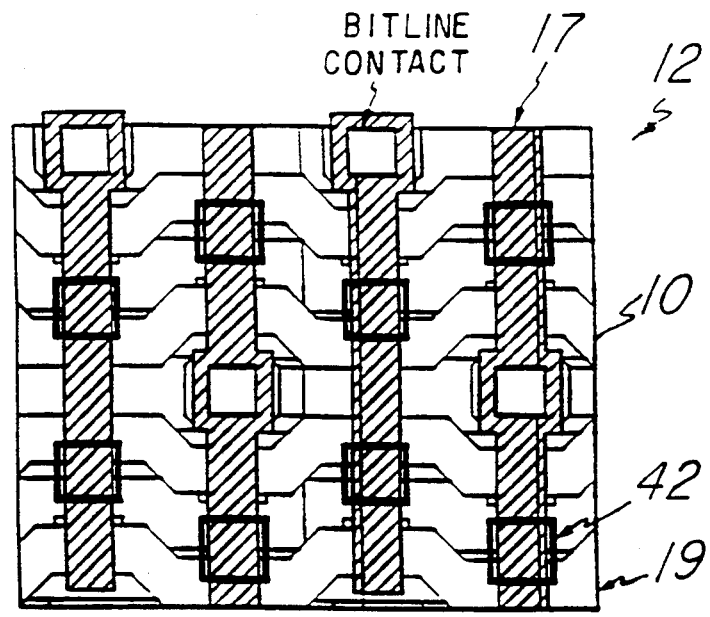
FIG. 4 is a top view of a portion of the memory array layout of the semiconductor integrated circuit device.

FIG. 4 is a top view of a portion of memory array 12. The memory cells of memory array 12 are of the modified trench capacitor type obtained through submicron technology. The memory cells are about 4.8 um$^2$ and are laid out in a double word line pitch. The bit lines 17 are polycide and triple twisted for improved noise immunity. The word lines 19 are polysilicon and are strapped every 64 bits.

Figure 5:
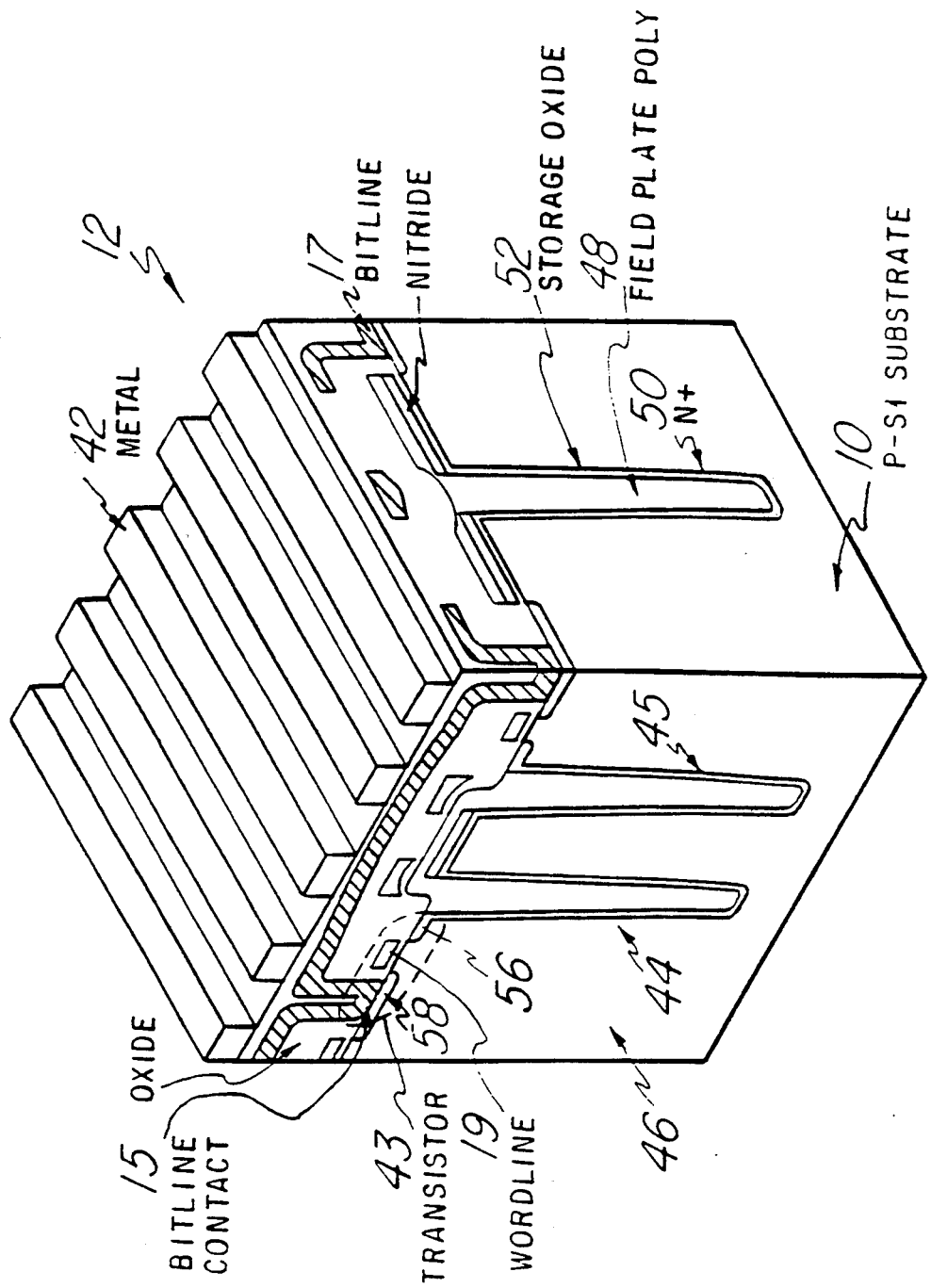
FIG. 5 is a cross sectional view of the memory cells of the memory array.
Figure 6:
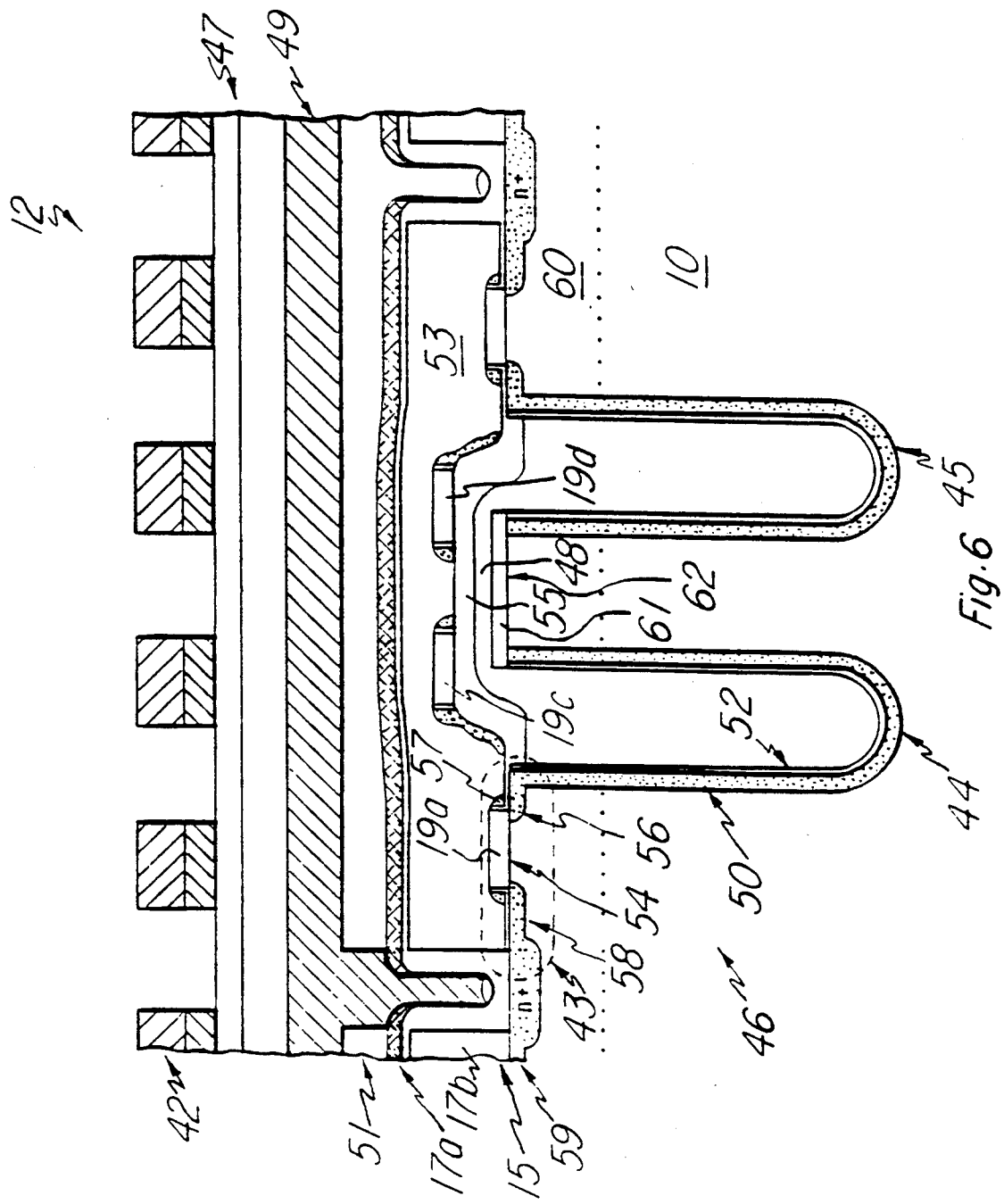
FIG. 6 is a side view of the memory cells.

FIG. 5 presents a three dimensional view of a portion of the memory array 12 while FIG. 6 presents a cross section view. An interconnect metal layer 42 accomplishes word line strapping. An oxide layer 47 separates metal layer 42 from a metal layer 49. Metal layer 49 is a multi level interconnect metal 49 that accomplishes contacts to the bit lines. It is used for filling contacts in the periphery of the DRAM as will be discussed later. An oxide layer 51 lies below interconnect metal 49 to provide isolation between the silicided bitlines 17 and metal layer 49. The bit lines 17 comprise a layer of titanium 17a overlying a layer of polysilicon 17b. An oxide layer 53 lies beneath the bit lines 17 and lies over the word lines 19. The word lines 19 have a submicron width of about 0.6 microns. Word line 19a forms the gate of pass transistor 43. It is separated from the substrate 10 by an oxide layer 54. Word lines 19c and 19d pass over the top trench capacitors 44 and 45 and connect to other trench capacitors not shown. They are separated from the polysilicon field plate 48 by an oxide layer 55. The word lines 19 have side walls 57 of nitride. An N+ diffusion 59 lies in the P-tank 60 underneath the bit line contacts 15 and between word line 19a and trench capacitor 44. The N+ diffusion 59 thus forms the source 56 and the drain 58 of the pass gate transistor 43. Underneath field plate 48, between the trench to trench space separating trench capacitors 44 and 45, lies a nitride layer 61. Between nitride layer 61 and P-tank 60 lies an oxide layer 62. It acts as a buffer layer between the silicon substrate 10 and the nitride layer 61 and as part of the field plate isolating dielectric. The trench capacitors 44 and 45 extend through the P-tank 60 into the P substrate of the silicon wafer 10. A layer 50 of implanted arsenic outside the trench capacitor walls creates the N+ storage node of the capacitors. The trench capacitor walls contain a layer 52 of oxide and nitride that acts as a dielectric layer between the arsenic trench wall implant and the polysilicon field plate 48. Transfer transistor 43 and trench capacitor 44 comprise memory cell 46.

Figure 7:
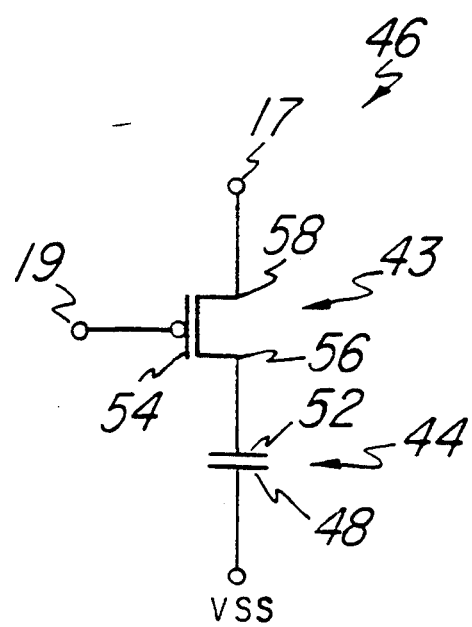
FIG. 7 is an electrical schematic diagram of a memory cell.

FIG. 7 is an electrical schematic diagram showing the electrical operation of transfer transistor 43 and trench capacitor 44. When data is to be stored on memory cell 46, the data is placed on bit line 17 and a high voltage signal (approximately 3.3 volts) is placed on gate 54. The voltage placed on bit line 17 is passed via source 56 to storage dielectric 52. Field plate 48 is tied to a reference potential Vss, ground, and thus a charge representing the voltage applied by bit line 17 is stored on storage dielectric 52. To store the data on storage dielectric 52, the positive voltage is removed from gate 54 thus stopping continuity between source 56 and drain 58.

Figure 8:
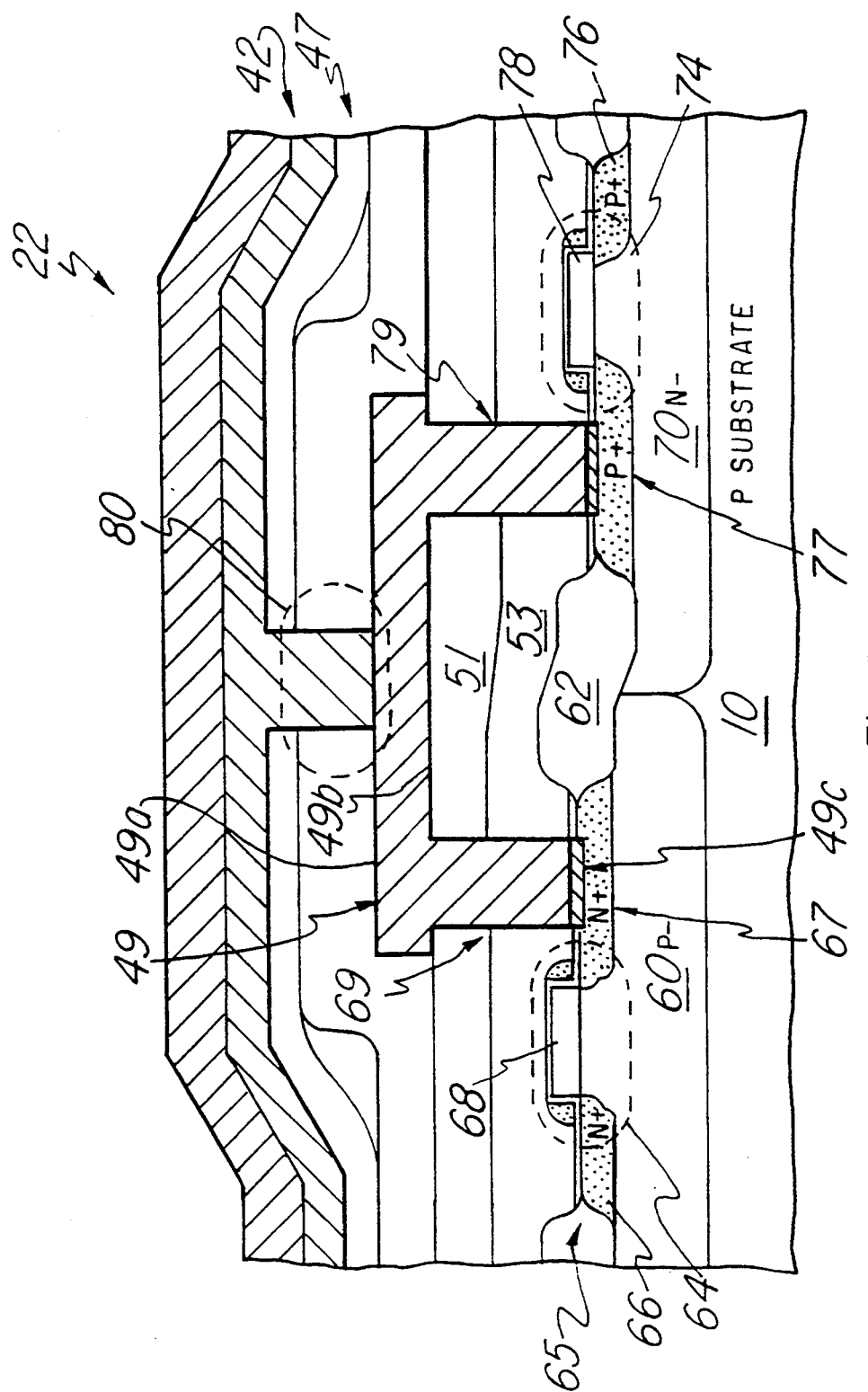
FIG. 8 is a side view of the peripheral circuitry of the semiconductor integrated circuit device.

Referring now to FIG. 8, a side view of a portion of the peripheral circuitry 22 of DRAM 10 is illustrated. P-tank 60 extends across the semiconductor wafer from memory array 12 to the periphery 22. A field oxide 62 separates the P-tank 60 from the N-tank 70 to form a CMOS inverted moat structure in the periphery. P-tank 60 contains a p-channel transistor 64 having an N+ diffusion 65 that forms the source 66 and the drain 67. The gate 68 of p-channel transistor 64 is polysilicon. The drain 67 is connected to metal layer 49 at contact 69. N-tank 70 contains an n-channel transistor 74 having a P+ diffusion 75 that forms the source 76 and the drain 77. The gate 78 of n-channel transistor 64 is polysilicon. The drain 77 connects to layer 49 at contact 79. Metal layer 49 connects to metal layer 42 at contact 80.

Still referring to FIG. 8, via contacts 69, 79, and 80 are high ratio aspect contacts. (Contacts and vias are used interchangeably herein although in a more precise reading, a contact may be an electrical connection between a metal layer and a silicon underlying area while a via may be an electrical connection between two metal layers.) The aspect ratio is obtained by dividing the depth of the via by the width (diameter) of the contact. Contacts 79 and 80 are about 1.5 microns deep and about 0.6 microns wide, giving them an aspect ratio on the order of about 2.5. The high aspect ratio contacts 69 and 79 are filled with metal layer 49. Metal layer 49 is a multilevel interconnect comprised of three layers: a top layer 49a of tungsten W; a middle layer 49b of titanium nitride TiN; and, a bottom layer of titanium silicide TiSi. The multilevel composition of metal layer 49 in combination with the manner in which it is placed into the contacts, advantageously fills the bottom of the high aspect ratio contacts with conductive material thereby fostering good electrical contact to the transistors.

FIGS. 9–12 are unscaled drawings illustrating successive stages in forming contacts 69 and 79 and metal level 49 in periphery 22.

Figure 9:
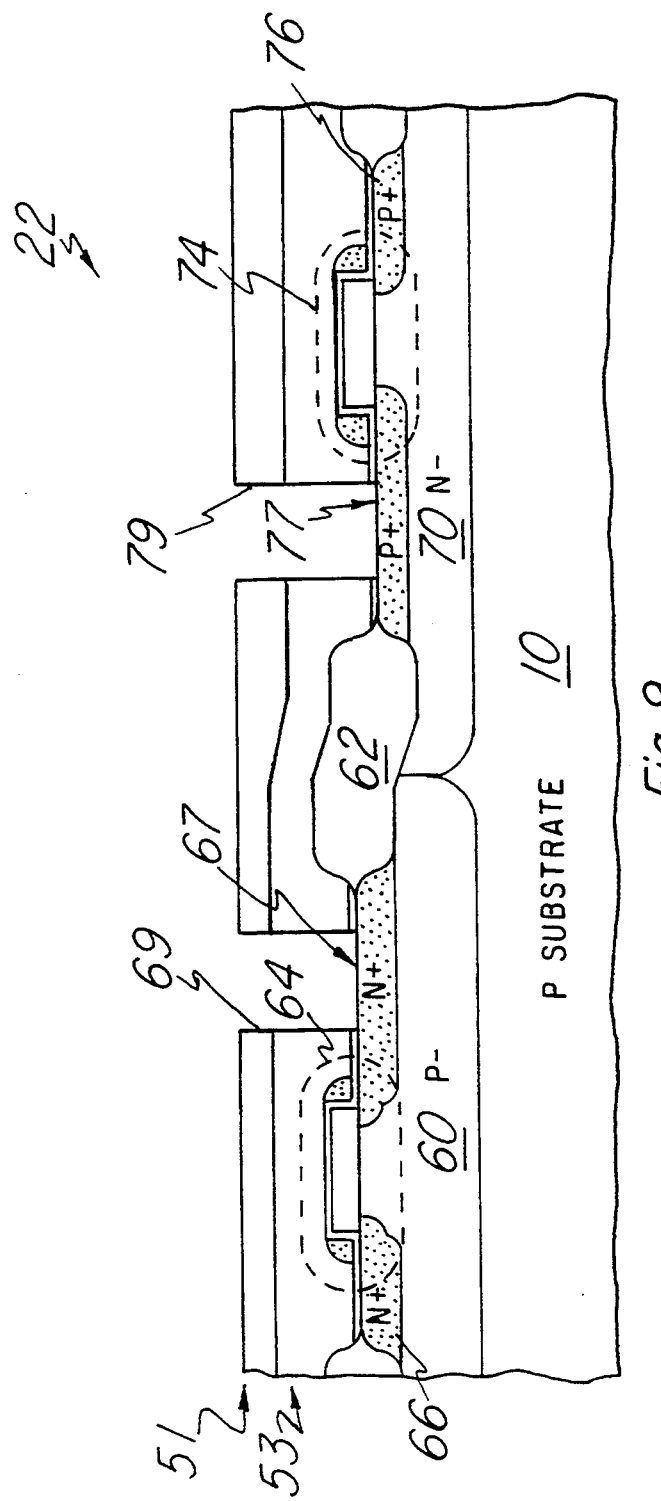
FIGS. 9–12 are side views of the peripheral structure illustrating successive stages in the manufacture thereof.

FIG. 9 reveals the resulting peripheral structure after forming vias 69 and 79 through oxides 51 and 53. (The P-tank 60, the N-tank 70, the field oxide 62, the transistor structures 64 and 74, the oxide coating 51, and the oxide coating 53 of the periphery have previously been created on substrate 10.) A pattern step first applies the via pattern on top of oxide layer 51 for etching the contacts. The periphery is then coated with a positive resist and the resist is exposed and developed. A high selective oxide etch, such as a plasma etch, is suitable to make the high aspect ratio contact openings through the oxide layers 51 and 53. The resist is then removed.

Figure 10:
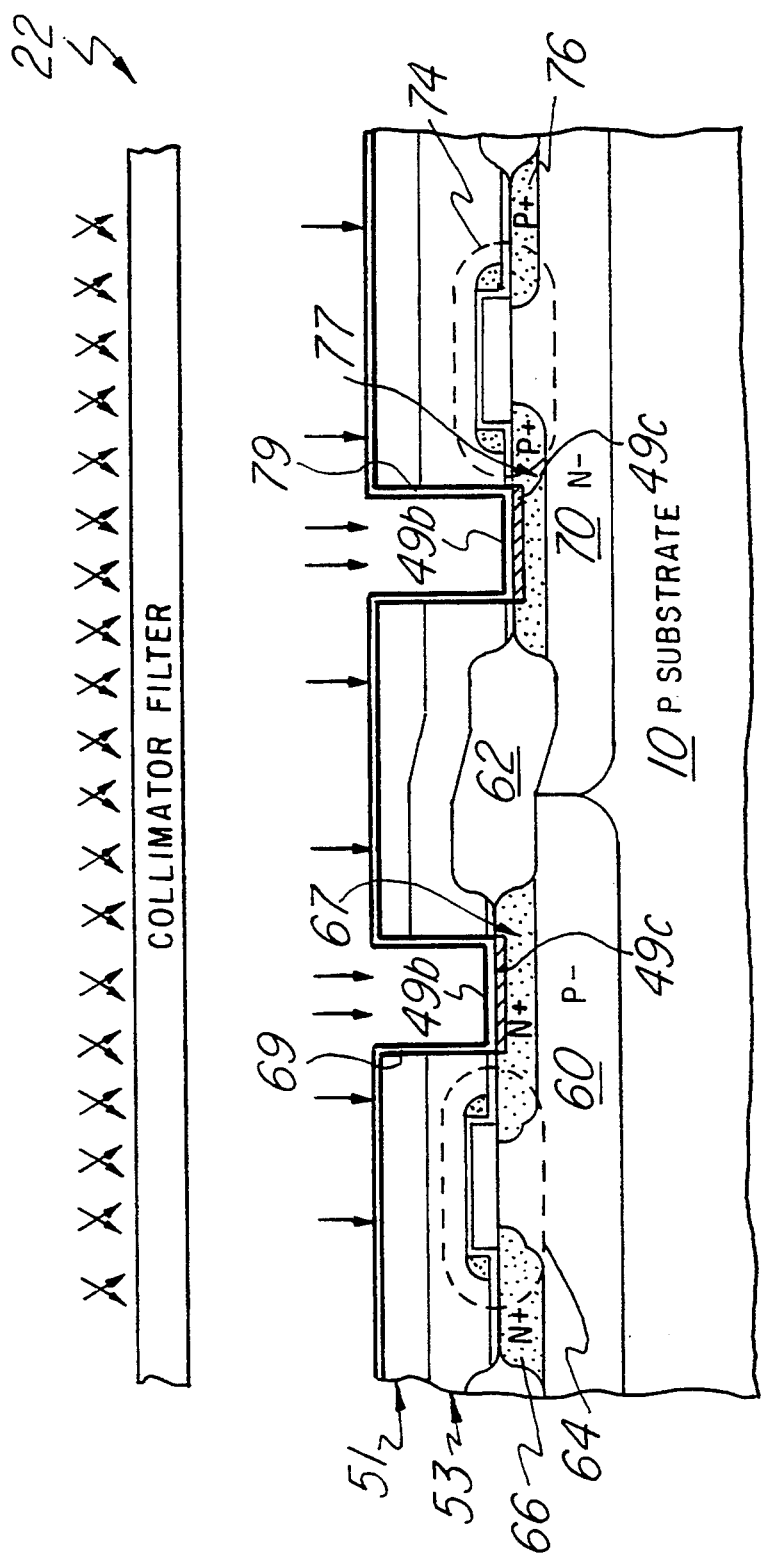

FIG. 10 reveals the resulting peripheral structure following the formation of the layer 49c of titanium silicide TiSi and the formation of the layer 49b of titanium nitride TiN in the contacts. The titanium metal is advantageously directionally deposited into the vias so that the metal particles strike the semiconductor wafer 10 in a substantially vertical manner. They travel in the vias almost parallel to the via walls and generally hit perpendicular to the via bottom. An apparatus suitable to directionally deposit the titanium is described in U.S. Pat. No. 4,824,544 issued on Apr. 25, 1989 to Mikalesen et al and assigned to IBM wherein a collimation filter is placed between the cathode of a sputter deposition rig and the target sample. The patent describes its collimation filter as being comprised of a plurality of tightly packed tubes. Before entering the tightly packed tubes, the sputter particles travel in random fashion; upon leaving the collimation filter, the sputter particles travel in a direction normal to the target.

In FIG. 10, directionally depositing the titanium allows the metal to effectively penetrate the narrow submicron contact openings and substantially cover the bottom and sidewalls of the contacts. Between about 500 to 2000Å of titanium directionally deposited through collimation is sufficient.

Still referring to FIG. 10, the titanium is sputtered into the contacts for a dual purpose, to perform a localized silicidation in order to lower the contact resistance and to apply a nucleation layer for a film of later added tungsten. After colliminated sputtering titanium, a thermal nitridization anneal reaction forms the titanium silicide layer 49c at the titanium silicon interface on the via bottom and also forms the titanium nitride layer 49b on top of the titanium silicidation layer and over the via walls. The titanium is reacted in a nitrogen containing ambient at a temperature and a time suitable to form nitride and silicide. Examples of suitable nitrogen containing compounds include ammonia and $O_2$. Between about 200 to 500 Å of silicide may be formed in the contacts by reacting the titanium in a nitrogen ambient at a temperature above 500° C. for a time between 30 to 60 minutes. For example, a reaction with $N_2+H_2$ at about 590° C. for approximately 30 minutes forms approximately 250 Å of silicide at the bottom of the contacts. However, in a RTP chamber, the reaction could take place very rapidly, in about a minute. The layer of silicide that is formed should be sufficient to make good electrical contact, however it should not exceed the junction depth of the diffusion of the transistor. This reaction also forms the TiN layer 49b. It acts as a sticking layer so that the tungsten metal layer 49a, next described, does not lift out of the contacts. The TiN layer 49b is thin enough so that it is left in the contacts; it not necessary to strip it out of the contacts and form another nucleation layer.

Figure 11:
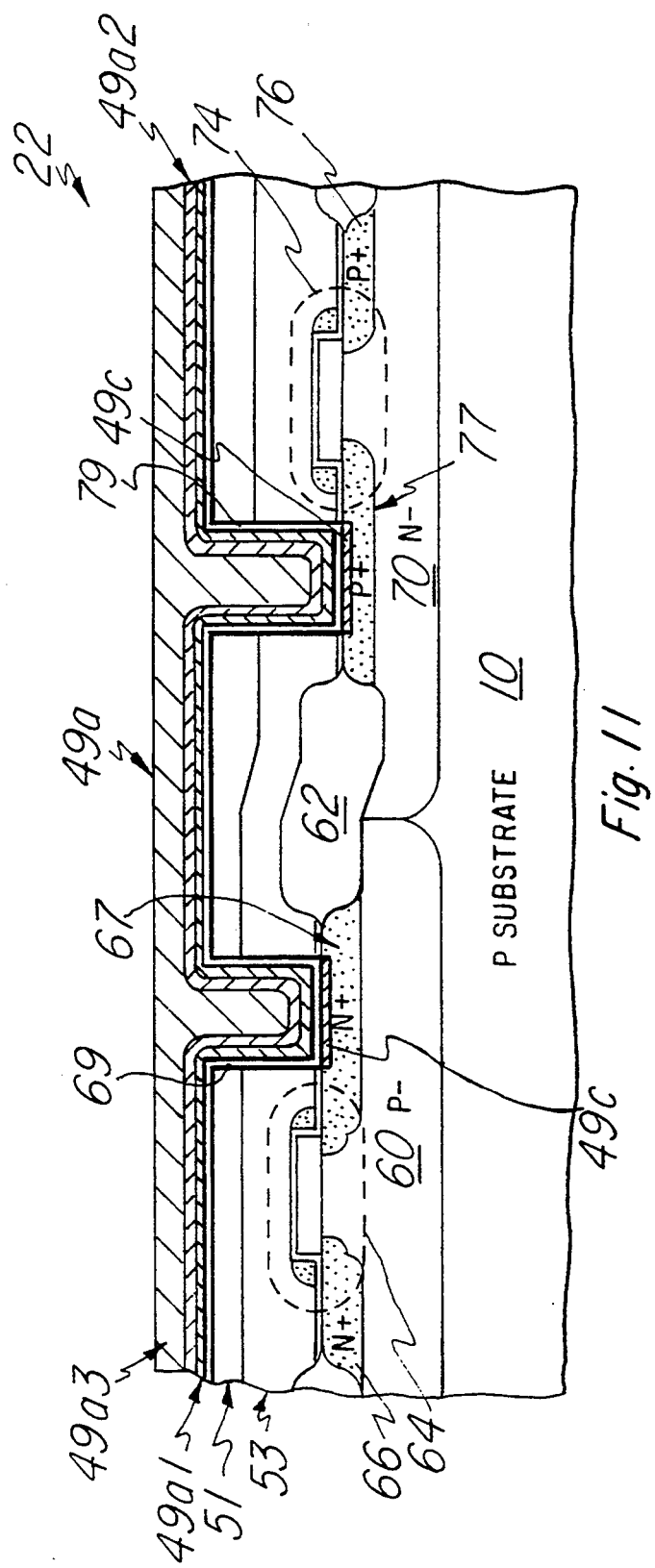

FIG. 11 is a side view of contact 69 illustrating the addition of the conductor metal layer 49a. It is comprised of multifilms of tungsten that may be formed by in-situ chemical vapor deposition, CVD. Three CVD depositions occur forming three overlying films of tungsten. The process parameters for each individual metal 49a film are optimized to yield the desired result for that film. Film 49a1 may range from approximately 200 to 1000 Å as deposited. The silane flow in the CVD process controls the deposition rate of this layer and is enhanced to prevent $WF_6$ attack. Film 49a1 blocks the other tungsten films from causing the titanium nitride layer 49b to peel off. The second tungsten film 49a2 overlying the first tungsten film 49a1 is a hydrogen reduced layer approximately 1000 to 3000 Å as deposited thick to conformally fill the contacts. The deposition rate of this layer is controlled by temperature of the CVD process. Film 49a2 provides good step coverage. The third overlying tungsten film 49a3 is a hydrogen reduced layer approximately 3000 to 5000 Å thick as deposited to smooth the overall tungsten 49 film and increase its reflectivity. The $WF_6$ flow in the CVD process controls the deposition rate of this film. The thickness of film 49a3 may be optimized to obtain sheet resistances ranging from about 100 to 300 milliohms per square.

Figure 12:
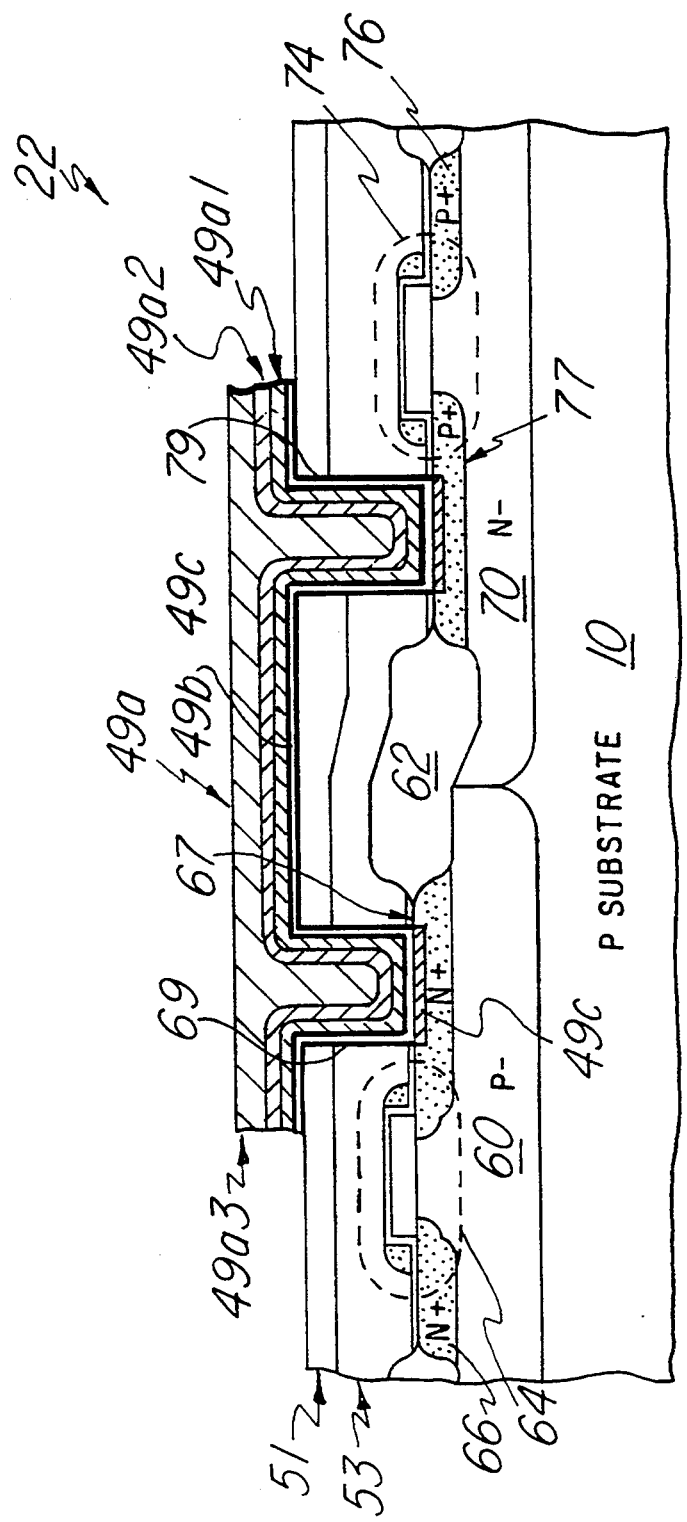

FIG. 12 depicts the resulting peripheral structure after patterning and etching the tungsten film 49a. The film 49a is patterned by coating it with a positive resist, exposing and developing the resist. And, the layer 49a is etched to remove the unneeded metal.

Thereafter, the semiconductor wafer 10 is further processed thereafter to yield the peripheral structure illustrated in FIG. 8. And, following the formation and patterning of metal layer 42, a protective overcoat is added and a pix is applied to protect the device from damage during packaging.

The conductive structure for the preferred embodiment of a contact thus comprises a layer of titanium silicide lies on the bottom of the contact. A layer of titanium nitride covers the titanium silicide layer and a tungsten layer covers the titanium layer. In forming ths structure, titanium may be advantageously colliminated sputtered into a submicron width via to substantially fill the bottom of the via with metal. The titanium may be annealed to form the titanium silicide interface and the titanium nitride sticking layer for the conductor layer of tungsten. The tungsten may be formed by chemical vapor deposition and a silane reduction step prevents the tungsten from attacking the titanium nitride layer.

While the contact and metalization process of the invention has been described above in connection with a dram, it is important to understand that the invention is generic and not limited to DRAMS and may be used in a wide variety of semiconductor devices such as logic devices, EPROMS, and microprocessors that are either CMOS or bipolar wherein a connection is needed from a metal layer to a substrate or another conductor layer. Also, other metals such as cobalt may be directionally deposited to form a silicide layer. Titanium tungsten may also be directionally deposited although it would not react to from a silicide layer.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method of fabricating a semiconductor device, comprising the steps of:
   providing a silicon substrate;
   forming a device region at the surface of said substrate;
   forming an insulating layer overlying said surface;
   forming an opening through said insulating layer to expose a portion of said device region;
   sputter depositing a film consisting only of titanium into the opening;
   annealing said titanium film in nitrogen to form silicide & nitride, and then chemical vapor depositing a film consisting essentially of tungsten into the opening, with silane reduction during said tungsten deposition, to prevent the tungsten from attacking the TiN;

depositing a second tungsten film by hydrogen reduction to conformally fill the opening; and depositing a third tungsten film by hydrogen reduction to smooth the tungsten layers.

2. The method of claim 1 wherein the titanium is directionally deposited into the opening.

3. The method of claim 2 wherein the titanium is directionally deposited into the opening by colliminated sputtering.

4. A method of fabricating a semiconductor device, consisting of the following steps:

provasiding a silicon substrate;

forming device regions at the surface of said substrate;

forming an insulating layer overlying said surface;

forming an opening through said insulating layer to expose a portion of said device region;

sputter depositing a film consisting only of titanium into the opening;

annealing said titanium film in nitrogen to form silicide & nitride, and then chemical vapor depositing a film consisting essentially of tungsten into the opening, with a reducing atmosphere during said tungsten deposition; then depositing a second tungsten film by reduction to conformally fill the opening; and then smoothing the resulting surface.

5. A method as in claim 4, wherein said opening has an aspect ratio on the order of about 2.5.

* * * * *